(12) United States Patent
Watanabe

(10) Patent No.: US 8,134,207 B2
(45) Date of Patent: Mar. 13, 2012

(54) HIGH BREAKDOWN VOLTAGE SEMICONDUCTOR CIRCUIT DEVICE

(75) Inventor: Atsuo Watanabe, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/028,157

(22) Filed: Feb. 8, 2008

(65) Prior Publication Data
US 2008/0237631 A1  Oct. 2, 2008

(30) Foreign Application Priority Data

Mar. 27, 2007 (JP) .................................. 2007-081693

(51) Int. Cl.
*H01L 29/66* (2006.01)
*H01L 27/12* (2006.01)
*H01L 29/786* (2006.01)
*H01L 21/02* (2006.01)
*H01L 21/70* (2006.01)

(52) U.S. Cl. ........ 257/343; 257/347; 257/348; 257/349; 257/350; 257/351; 257/352; 257/353; 257/354; 257/409; 257/509; 257/510

(58) Field of Classification Search .................. None
See application file for complete search history.

(56) References Cited

U.S. PATENT DOCUMENTS

| | | | |
|---|---|---|---|
| 5,241,210 A | | 8/1993 | Nakagawa et al. |
| 6,150,697 A * | | 11/2000 | Teshigahara et al. ......... 257/347 |
| 6,198,130 B1 * | | 3/2001 | Nobuto et al. ................ 257/343 |
| 6,225,664 B1 * | | 5/2001 | Endo et al. .................... 257/347 |
| 6,307,224 B1 | | 10/2001 | Shirai |
| 6,392,275 B1 * | | 5/2002 | Jang .............................. 257/343 |
| 2002/0043699 A1 * | | 4/2002 | Akiyama ....................... 257/575 |
| 2002/0125530 A1 * | | 9/2002 | Imam et al. ................... 257/343 |
| 2004/0169251 A1 * | | 9/2004 | Ohyanagi et al. ............. 257/511 |
| 2005/0001265 A1 * | | 1/2005 | Shiraki et al. ................ 257/330 |
| 2005/0184338 A1 * | | 8/2005 | Huang et al. ................. 257/335 |
| 2005/0242369 A1 * | | 11/2005 | Udrea et al. .................. 257/107 |

(Continued)

FOREIGN PATENT DOCUMENTS

DE  198 11 604 A1  9/1998

(Continued)

OTHER PUBLICATIONS

S.M. Sze "Semiconductor Devices. Physics and Technology. 2nd Edition", © 2002 John Wiley and Sons, p. 130.*

(Continued)

*Primary Examiner* — N Drew Richards
*Assistant Examiner* — Michael Jung
(74) *Attorney, Agent, or Firm* — Antonelli, Terry, Stout & Kraus, LLP.

(57) ABSTRACT

In a high breakdown voltage semiconductor element among elements integrated together on an SOI substrate in which its rated voltage is shared between an embedded oxide layer and a drain region formed by an element active layer, both high integration and high breakdown voltage are realized while also securing suitability for practical implementation and practical use. The high breakdown voltage is realized without hampering size reduction of the element by forming an electrically floating layer of a conductivity type opposite to that of the drain region at the surface of the drain region. Further, the thickness of the embedded oxide layer is reduced to a level suitable for the practical implementation and practical use by setting the thickness of the element active layer of the SOI substrate at 30 μm or more.

18 Claims, 14 Drawing Sheets

U.S. PATENT DOCUMENTS

2007/0052058 A1* 3/2007 Hirler et al. .................. 257/492
2007/0090458 A1* 4/2007 Muramoto et al. ........... 257/347

FOREIGN PATENT DOCUMENTS

| JP | 2005-64472 | 3/2005 |
|---|---|---|
| WO | WO 97/04488 | 2/1997 |

OTHER PUBLICATIONS

Sung-Lyong Kim, et al., 1200V Interconnection Technique with Isolated Self-Shielding Structure, Pro. 18$^{th}$ Intnl, Symp, on Power Semiconductor Devices & IC's, Jun. 4-8, 2006.

European Search Report issued Mar. 1, 2010; Application No. 08002482.1-2203/1976011.

Ludikhuize, A.W., Institute of Electrical and Electronics Engineers: "A Review of Resurf Technology"; ISPSD '2000, May 22-25, 2000; pp. 11-18.

Pol, Van Der J.A., et al.; A-BCD: An Economic 100V RESURF Silicon-On-Insulator BCD Technology for Consumer and Automotive Applications; ISPSD'2000, May 22-25, 2000, pp. 327-330.

Disney, D.R., et al.; "A new 800V lateral MOSFET with dual conduction paths"; Proceedings of 2001 International Symposium on Power Semiconductor Devices & ICs, Jun. 2001, pp. 399-402.

Rotter, Thomas, et al: "High-Voltage Extension (VBR≧800 V) for Smart-Power SOI Technologies," Electron Devices Meeting 2004. IEDM Technical Digest. IEEE International, San Francisco, CA., USA Dec. 13-15, 2004. Piscataway, NJ, USA, IEEE, Dec. 13, 2004, pp. 447-450, XP010788813, DOI: DOI:10, 1109/IEDM.2004. 1419184, ISBN: 978-0-7803-8684-6.

* cited by examiner

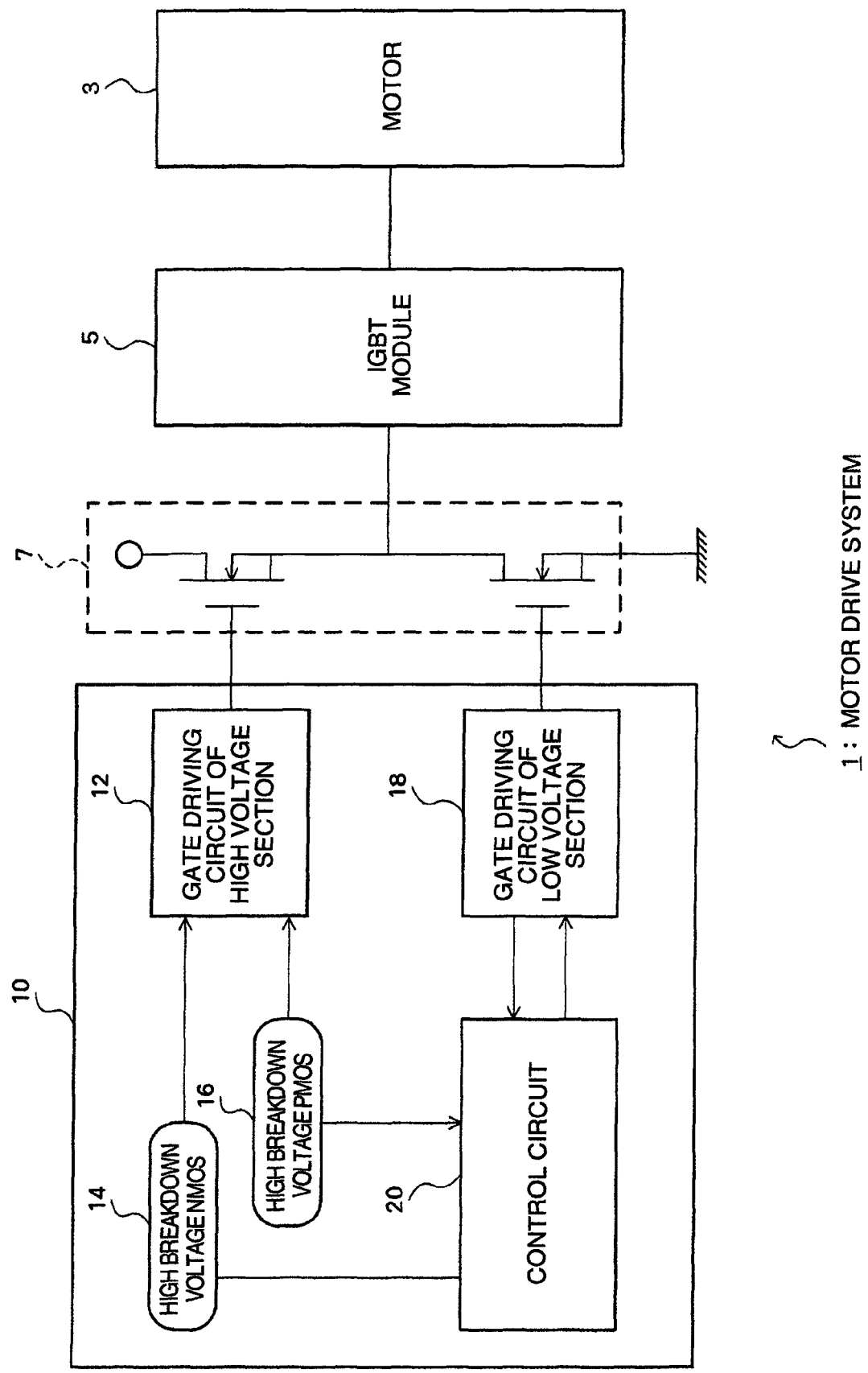

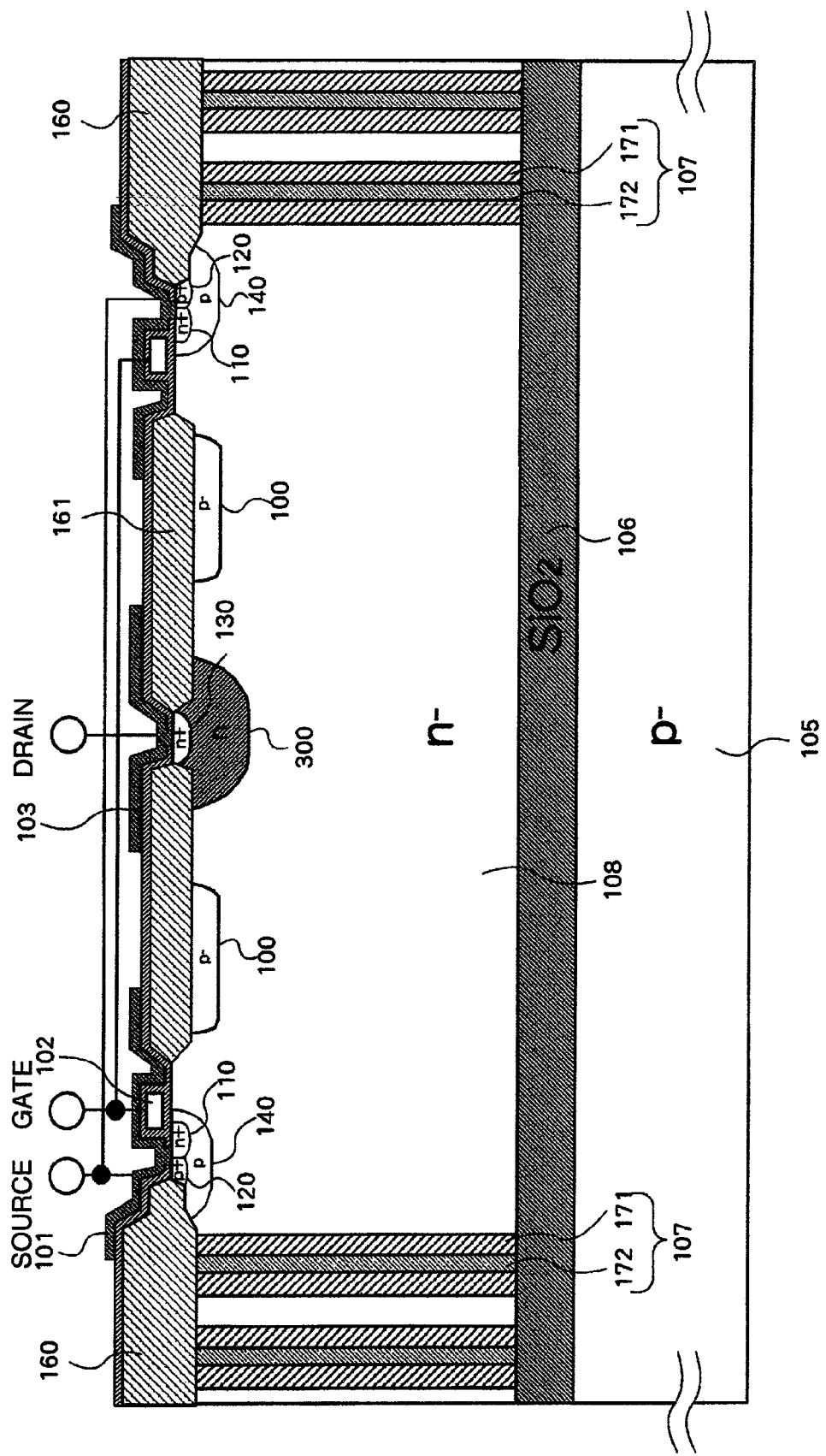

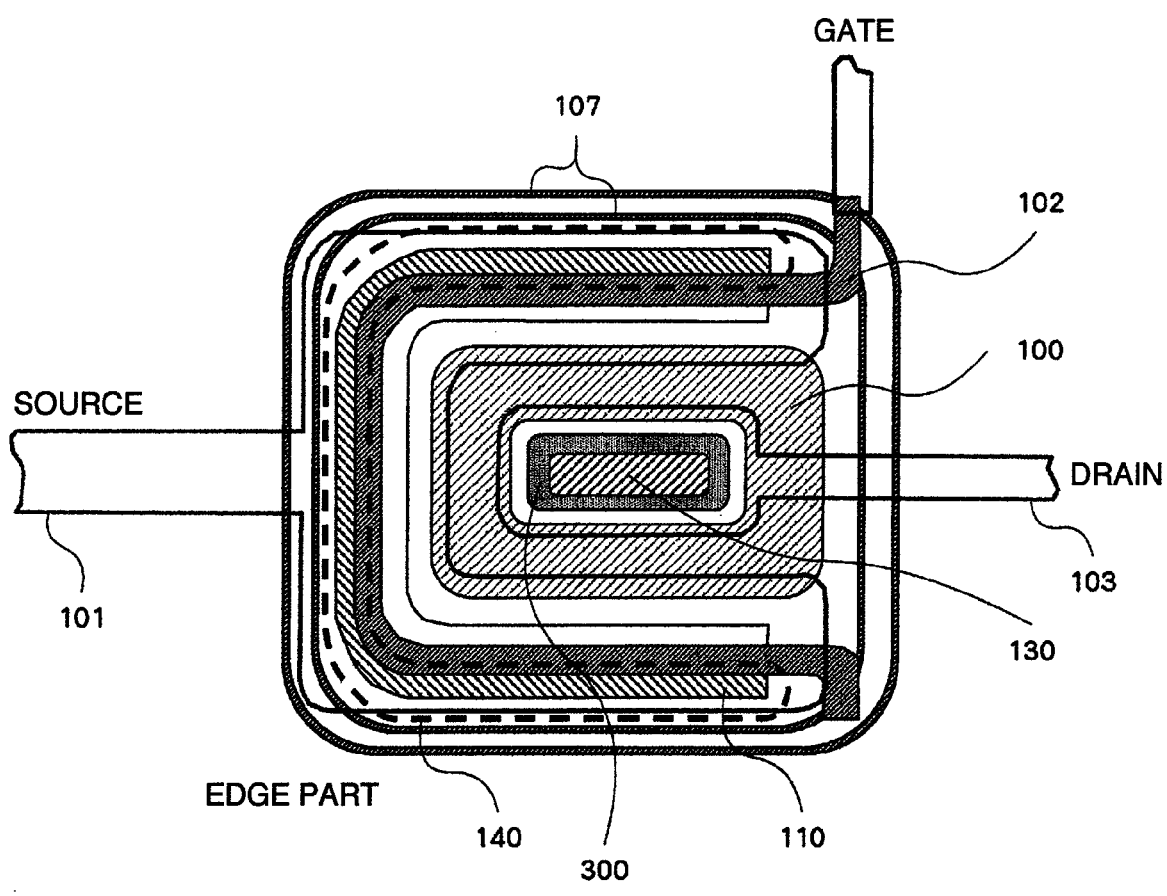

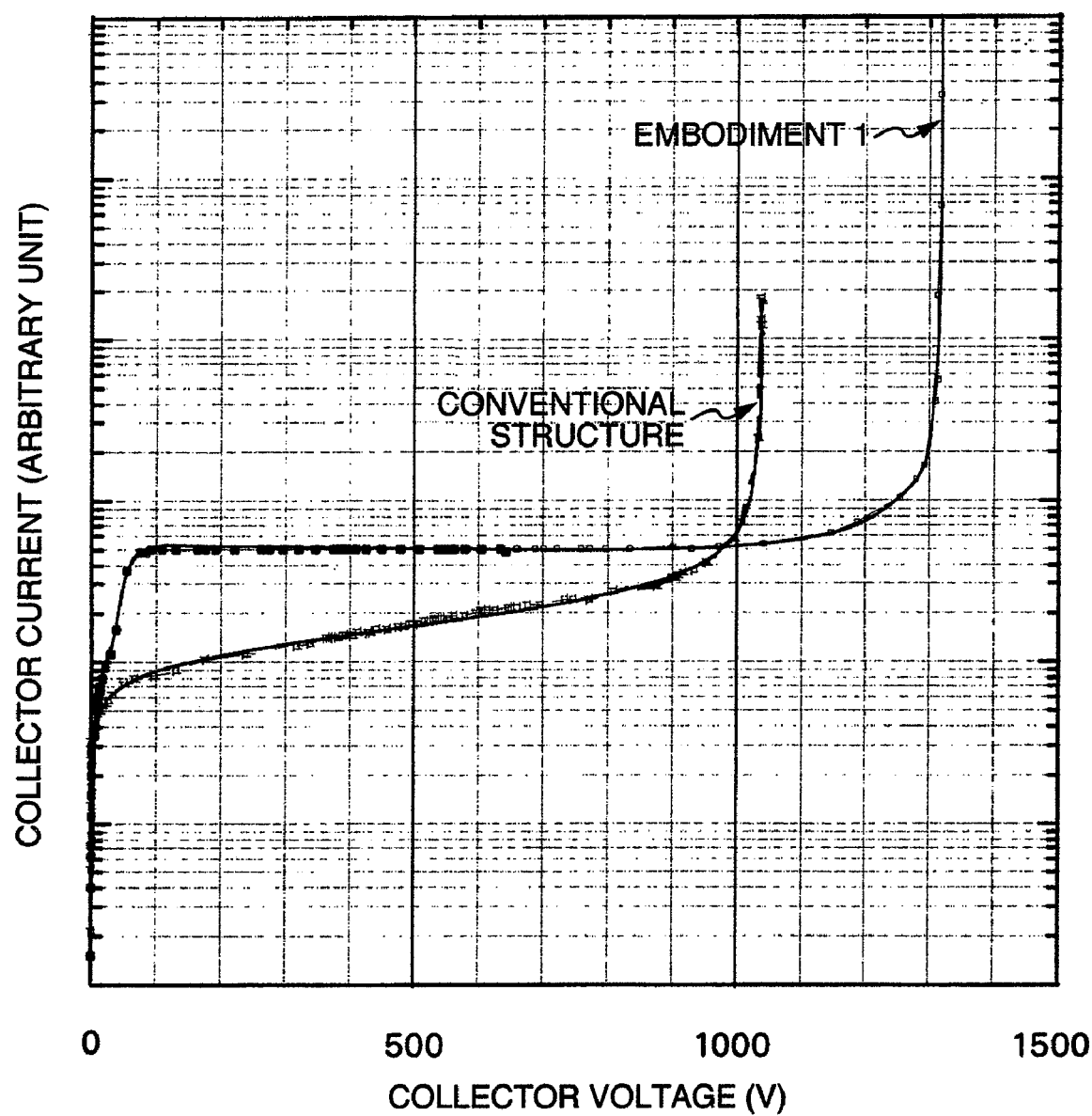

VOLTAGE THAT CAN BE SHARED BY SILICON ACTIVE LAYER (V)

HIGH BREAKDOWN VOLTAGE SEMICONDUCTOR CIRCUIT DEVICE

BACKGROUND OF THE INVENTION

The present invention relates to a semiconductor device employing dielectric isolation for insulation between elements, and in particular, to a semiconductor device for optimally controlling a power device for driving a high power motor.

A dielectric isolation semiconductor device (semiconductor device employing dielectric isolation for insulation between elements) is sometimes employed as a semiconductor device for controlling a power device. The dielectric isolation semiconductor device is a semiconductor device in which a high breakdown voltage element, a high current output circuit and a low breakdown voltage logic circuit are integrated together, for example, and each element is surrounded by dielectric material (e.g. silicon dioxide film) and thereby insulated from the substrate and other elements against high voltage. For example, a dielectric isolation semiconductor device for driving a motor includes various circuits such as a gate driving circuit of the high-voltage circuit section, a high breakdown voltage MOS transistor for supplying a control signal to the high voltage side gate driving circuit, and a control logic circuit.

FIG. 12 is a cross-sectional view showing a high breakdown voltage n-type MOS transistor which is formed in a dielectric isolation semiconductor device having conventional structure. In FIG. 12, the reference numeral "101" denotes a source electrode, "102" denotes a gate electrode, and "103" denotes a drain electrode. The source electrode 101 is electrically connected to an n+ heavily doped source region 110 and a p+ heavily doped source region 120 by ohmic contact. The drain electrode 103 is electrically connected to an n+ heavily doped drain region 130 by ohmic contact.

A p-type channel region 140 is a p-type doped region, in which an n-channel inversion layer is formed right under the gate electrode 102. These n-type/p-type regions are formed on a silicon substrate that is called a "SOI (Silicon On Insulator) substrate".

The SOI substrate is a substrate made up of a silicon support substrate 105, a silicon dioxide layer 106 and a silicon active layer 108. The silicon dioxide layer 106, sandwiched between the silicon support substrate 105 and the silicon active layer 108, will hereinafter be referred to as an "embedded oxide layer".

In the silicon active layer 108, a dielectric isolation region 107 for electrically isolating the element from surrounding regions is formed as a substantially vertical region reaching from the primary surface of the silicon active layer 108 to the embedded oxide layer 106. The dielectric isolation region 107 includes silicon dioxide films 171 (formed as side walls on both sides) and a polysilicon layer 172 embedded in the gap between the silicon dioxide films 171. In prescribed areas on the primary surface of the silicon active layer 108, thick silicon dioxide layers 150 (hereinafter referred to as "field oxide layers") are formed, by which the p-type/n-type doped regions on the primary surface of the silicon active layer 108 are separated from each other. Over the field oxide layers 150, a CVD layer 109 (made of silicon dioxide) is formed.

In the above element having the conventional structure, a p-type impurity diffusion region 131 is formed under the field oxide layer 150 between the source electrode 101 and the drain electrode 103 so that the OFF state (no current flowing between the source and the drain) can be maintained even when high voltage is applied to the source electrode 101 and the drain electrode 103. The p-type impurity diffusion region 131 is connected to the p-type channel region 140.

Incidentally, the p-type impurity diffusion region 131 in the cross-sectional view of FIG. 12, which looks as if two separate regions 131 are placed on both sides of the n+ heavily doped drain region 130, is actually one region formed continuously. Thus, the above element having the conventional structure is characterized by a connection configuration that restricts one side by the electric potential of the p-channel region.

SUMMARY OF THE INVENTION

However, in the above element having the conventional structure, electrons flowing from the source to the drain have to travel through a region between the two p-type channel regions 140 shown in FIG. 12, formed on the both sides (at the both edges of the gate electrode 102, as indicated by the path (arrow) 141 since the p-type impurity diffusion region 131 for securing high breakdown voltage (dielectric strength) is connected to the p-type channel region 140. The path 141 can be regarded as a channel of the so-called "parasitic junction FET", which causes a problem of sharply increasing resistance and disabling the ON current when the two p-type channel regions 140 on the both sides of the gate electrode 102 are placed close to each other for the size reduction of the gate electrode 102. Thus, such an element including a parasitic junction FET as a channel has a structural drawback in that the shortening of the gate electrode is impossible. Further, the above element having the conventional structure bears a restriction that both the source regions 110 and 120 have to be placed on the both sides of the gate electrode 102, which disables improvement of the characteristics of the element and reduction of the size (area) of the element.

It is therefore an object of the present invention to provide an element structure capable of realizing both high integration and high breakdown voltage of a MOS transistor for supplying high power supply voltage to a high voltage side gate driving circuit for the top arm.

Another object of the present invention is to provide an element structure capable of realizing high breakdown voltage while also being suitable for practical implementation and practical use.

In order to achieve the above objects, a semiconductor device in accordance with an aspect of the present invention comprises: a support substrate; an insulating layer which is stacked on the support substrate; a semiconductor layer which is stacked on the insulating layer; and at least one MOS transistor which is configured in a semiconductor region formed by separating the semiconductor layer by dielectric material for isolation reaching from a primary surface of the semiconductor layer to the insulating layer. The MOS transistor includes: a first semiconductor region as a lightly doped drain region implemented by the semiconductor layer; a second semiconductor region contained in the first semiconductor region and having a conductivity type opposite to that of the first semiconductor region; and a field oxide layer which is provided between a source electrode and a drain electrode to adjoin at least part of a surface of the first semiconductor region. The second semiconductor region is formed in an electrically floating state at a position where the first semiconductor region adjoins the field oxide layer.

With this configuration, both high integration and high breakdown voltage of MOS transistors for supplying high power supply voltage can be realized at the same time.

Preferably, in the semiconductor device, the thickness of the insulating layer is set at 4 µm or less, and the thickness of the semiconductor layer is set at 30 µm or more.

With this configuration, it is not needed to increase the thickness of the insulating layer (embedded oxide layer) to an extent hampering the practical use of the semiconductor device even in cases where a prescribed high breakdown voltage is achieved, thereby a high breakdown voltage semiconductor device ready for mass production by use of ordinary semiconductor device manufacturing equipment can be provided.

Preferably, in the semiconductor device, at least part of the second semiconductor region is placed under the source electrode.

With this configuration, formation of an electric field concentration point under the electrode can be suppressed.

Preferably, in the semiconductor device, the MOS transistor further includes a third semiconductor region contained in the first semiconductor region and having the same conductivity type as the first semiconductor region and a higher impurity concentration than the first semiconductor region. The third semiconductor region is formed on a surface of the first semiconductor region adjoining the insulating layer to be placed at least under a drain-extracting region.

With this configuration, the breakdown voltage of the semiconductor device can be increased.

Preferably, in the semiconductor device, the MOS transistor further includes a fourth semiconductor region contained in the first semiconductor region and having the same conductivity type as the second semiconductor region and a higher impurity concentration than the second semiconductor region. The fourth semiconductor region is formed under the source electrode to spread to a side face of the dielectric isolation region.

With this configuration, deterioration of the breakdown voltage due to the electric field concentration can be prevented.

Preferably, in the semiconductor device, the MOS transistor further includes at least one fifth semiconductor region contained in the first semiconductor region and having the same conductivity type as the second semiconductor region and a higher impurity concentration than the second semiconductor region. The fifth semiconductor region is formed on part of a surface of the first semiconductor region on the source electrode's side to surround the second semiconductor region.

With this configuration, the electric field concentration in the vicinity of edges of the source and the drain electrodes can be relaxed.

In accordance with another aspect of the present invention, there is provided a semiconductor device comprising: a support substrate; an insulating layer which is stacked on the support substrate; a semiconductor layer which is stacked on the insulating layer; at least one first conductivity type MOS transistor forming a channel region of a first conductivity type, which is configured in a semiconductor region formed by separating the semiconductor layer by dielectric material for isolation reaching from a primary surface of the semiconductor layer to the insulating layer; and at least one second conductivity type MOS transistor forming a channel region of a second conductivity type, which is configured in another semiconductor region formed by separating the semiconductor layer by dielectric material for isolation reaching from the primary surface of the semiconductor layer to the insulating layer. The first conductivity type MOS transistor includes: a first semiconductor region as a lightly doped drain region implemented by the semiconductor layer; a second semiconductor region contained in the first semiconductor region and having a conductivity type opposite to that of the first semiconductor region; and a field oxide layer which is provided between a source electrode and a drain electrode to adjoin at least part of a surface of the first semiconductor region. The second semiconductor region is formed in an electrically floating state at a position where the first semiconductor region adjoins the field oxide layer. The second conductivity-type MOS transistor includes: a low impurity-concentration drain region and a high impurity-concentration drain region contained in the first semiconductor region and having conductivity types opposite to that of the first semiconductor region; a source electrode and a gate electrode surrounded by the drain regions; a third semiconductor region contained in the low impurity-concentration drain region and having a conductivity type opposite to that of the low impurity-concentration drain region; and a field oxide layer which is provided between the source electrode and a drain electrode to adjoin at least part of a periphery of the low impurity-concentration drain region and part of a periphery of the high impurity-concentration drain region. The third semiconductor region is formed in the electrically floating state at a position where the low impurity-concentration drain region adjoins the field oxide layer.

With this configuration, a high breakdown voltage n-channel MOS transistor and a high breakdown voltage p-channel MOS transistor can be implemented at the same time, by which a low-loss level shift circuit can be realized.

In accordance with another aspect of the present invention, there is provided a semiconductor device comprising: a support substrate; an insulating layer which is stacked on the support substrate; a semiconductor layer which is stacked on the insulating layer; and at least one IGBT (Insulated Gate Bipolar Transistor) which is configured in a semiconductor region formed by separating the semiconductor layer by dielectric material for isolation reaching from a primary surface of the semiconductor layer to the insulating layer. The IGBT includes: a first semiconductor region as a lightly doped collector region implemented by the semiconductor layer; a second semiconductor region contained in the first semiconductor region and having a conductivity type opposite to that of the first semiconductor region; and a field oxide layer which is provided between an emitter electrode and a collector electrode to adjoin at least part of a periphery of the first semiconductor region. The second semiconductor region is formed in an electrically floating state at a position where the first semiconductor region adjoins the field oxide layer.

With this configuration, a low-loss semiconductor switching element can be realized.

In accordance with another aspect of the present invention, there is provided a manufacturing method of a semiconductor device, comprising: a step of forming a first semiconductor region in a substrate including a support substrate, an insulating layer stacked on the support substrate and a semiconductor layer stacked on the insulating layer, by separating the semiconductor layer by dielectric material for isolation reaching from a primary surface of the semiconductor layer to the insulating layer; a step of forming a second semiconductor region of a conductivity type opposite to that of the first semiconductor region at a surface of the first semiconductor region while placing the second semiconductor region in an electrically floating state; a step of forming a field oxide layer for isolation of an element active layer on the first semiconductor region with the second semiconductor region formed therein, by executing selective oxidation; and a step of forming a gate oxide layer and a gate electrode on the surface of the first semiconductor region after the formation of the field oxide layer.

With the manufacturing method, a semiconductor device realizing both high integration and high breakdown voltage can be manufactured.

Other objects, features and advantages of the invention will become apparent from the following description of the embodiments of the invention taken in conjunction with accompanying drawings.

BRIEF DESCRIPTION OF THE DRAWINGS

FIG. 1 is a block diagram showing a motor drive system employing a dielectric isolation semiconductor device in accordance with the present invention.

FIG. 2 is a cross-sectional view showing a dielectric isolation semiconductor device in accordance with a first embodiment of the present invention.

FIG. 3 is a plan view of the dielectric isolation semiconductor device of the first embodiment.

FIG. 4 is a graph showing element characteristics of the dielectric isolation semiconductor device of the first embodiment.

DETAILED DESCRIPTION OF THE EMBODIMENTS

Figure 12:
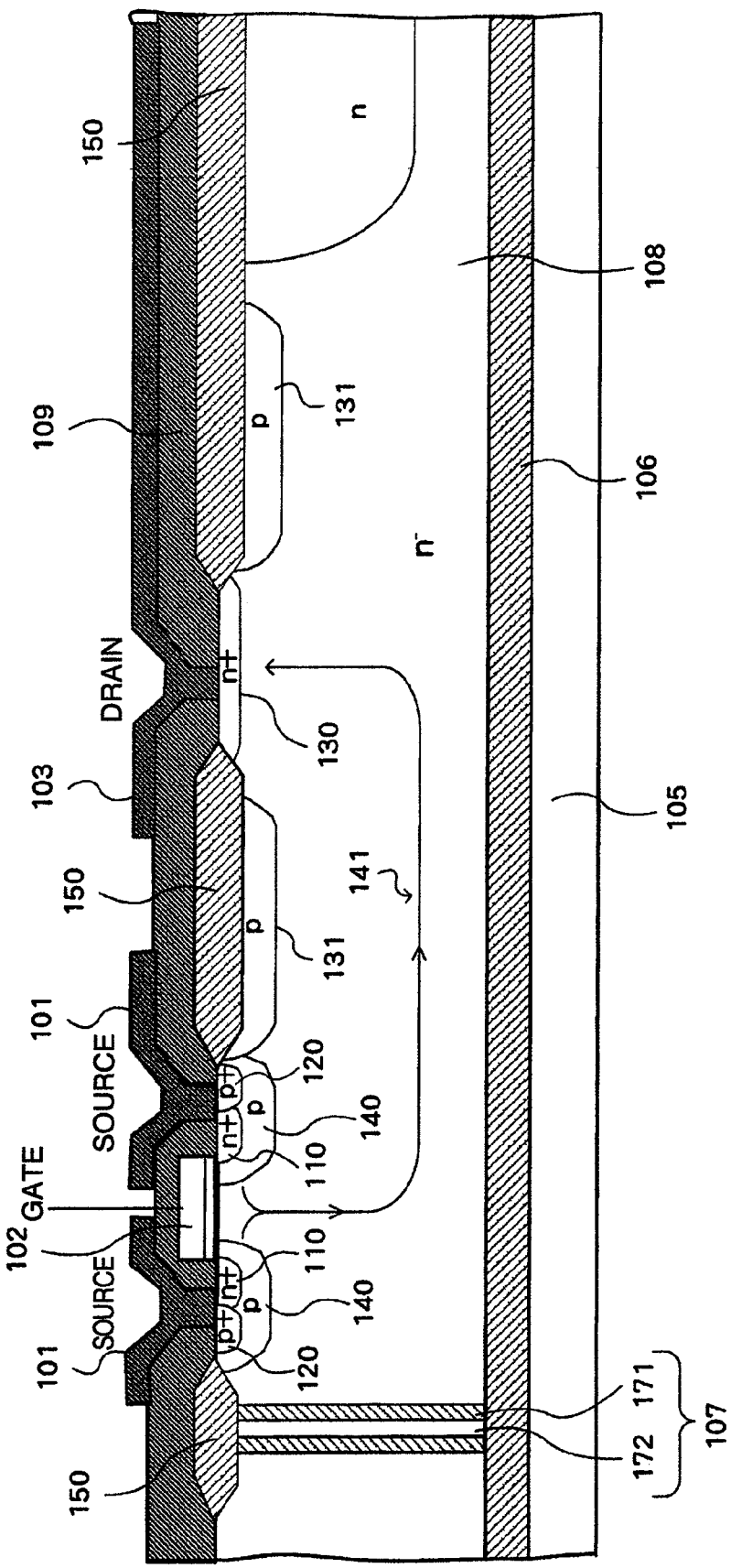
FIG. 12 is a cross-sectional view showing a conventional dielectric isolation semiconductor device.

Referring now to the drawings, a description will be given in detail of preferred embodiments in accordance with the present invention. In the drawings for the explanation of the embodiments (as well as FIG. 12 for the explanation of the conventional technology), the same or equivalent components are assigned the same or similar reference characters and repeated explanation thereof is omitted for brevity.

FIG. 1 is a block diagram showing a motor drive system employing a dielectric isolation semiconductor device in accordance with an embodiment of the present invention. The motor drive system 1 shown in FIG. 1 includes an IGBT module 5 for driving a motor 3, a driving circuit 7 having two MOS transistors (top and bottom MOS transistors for controlling the switching operation of the IGBT module 5) as its basic components, and a dielectric isolation semiconductor device 10 for optimally controlling the driving circuit 7.

First, the outline of the dielectric isolation semiconductor device 10 will be described below. As shown in FIG. 1, the dielectric isolation semiconductor device 10 includes a high voltage-side gate driving circuit 12, high breakdown voltage MOS transistors 14 and 16 for supplying control signals to the high voltage side gate driving circuit 12, a low voltage-side gate driving circuit 18, a control circuit 20 serving as an interface with a digital control IC controlling the whole system, and various protection circuits (not shown).

An element forming the high voltage-side gate driving circuit 12 integrated into the dielectric isolation semiconductor device 10 has the MOS transistor structure. Since the high voltage side gate driving circuit 12 is designed to operate while being connected to the gate electrode of the top arm element of an output circuit of the motor driver, the source voltage of the high voltage-side gate driving circuit 12 rises above high power supply voltage of the load. Thus, the gate voltage of the high voltage side gate driving circuit 12 has to be pushed up to a high voltage. The level shift of the gate voltage is implemented by use of the high breakdown voltage n-type MOS transistor 14 and the high breakdown voltage p-type MOS transistor 16.

In the dielectric isolation semiconductor device 10 in accordance with the embodiment, semiconductor, especially silicon, is employed as the semiconducting material and a SOI substrate advantageous for the dielectric isolation is employed as the substrate. In the SOI substrate, deep trenches reaching from the primary surface of the silicon active layer to the embedded oxide layer are formed and each trench is filled with silicon dioxide films and a material such as polysilicon, by which each element formation region is isolated dielectrically (dielectric isolation). Thereafter, a region capable of preventing electric field concentration is formed by implanting impurity ions (of a conductivity type different from that of the element-forming silicon active layer) into the surface by the ion implantation technology. Further, in order to define regions (areas) forming other MOS transistors, thick silicon dioxide layers (field oxide layers) are formed in prescribed areas by the LOCOS (Local Oxidation of Silicon) method. After those processes, a channel region, a source region, a drain region and other active regions are formed by carrying out a gate oxidation process, deposition and processing of polysilicon as the gate electrode, an ion implantation process and a heat treatment process. Finally, the manufacture of the dielectric isolation semiconductor device 10 is completed by a metalization process for forming electrodes and wiring. The details of the processes will be described later.

Embodiment 1

First, the details of the dielectric isolation semiconductor device 10 in accordance with a first embodiment of the present invention will be described referring to FIGS. 2 and 3.

FIG. 2 is a cross-sectional view showing the dielectric isolation semiconductor device 10 in accordance with the first embodiment. In the first embodiment, the present invention is applied to a dielectric isolation semiconductor device including a high breakdown voltage n-MOS transistor provided with an n-type channel. In FIG. 2, elements other than the n-MOS transistor are omitted for brevity. Incidentally, while a p-type semiconductor is employed for a semiconductor substrate, especially the silicon support substrate 105, in this embodiment, it is also possible to employ an n-type semiconductor for the semiconductor substrate.

The so-called "SOI substrate" is formed by stacking a high-resistance (i.e. low impurity concentration) n-type silicon active layer 108 on the silicon support substrate 105 via a silicon dioxide layer (embedded oxide layer) 106. In the SOI substrate, substantially perpendicular trenches, reaching from the primary surface of the silicon active layer 108 to the silicon dioxide layer 106, are formed. A dielectric isolation region 107 is formed by filling the trench with dielectric material. The trench, having a planar shape (horizontal sectional shape) like a closed loop, has the function of insulating the inside of the dielectric isolation region 107 (i.e. inside of the closed loop) from the outside. Silicon dioxide films 171 are formed on the both side walls of the trench, and a poly-silicon layer 172 is embedded in the gap between the side wall oxide films 171.

As shown in FIG. 2, the silicon active layer 108 in this embodiment is surrounded by two dielectric isolation regions 107. The number of multifold dielectric isolation regions 107 surrounding the element formation region may be set properly based on the specifications of rated voltage of the element and the thickness of the silicon dioxide film 171 formed on the side walls of each trench.

In the central area of the silicon active region (silicon active layer 108) surrounded by the dielectric isolation regions 107, an n+ type drain region 130 and an n-type drain region 300 are formed by the ion implantation technology. Then, a p-type doped region 100 is formed to surround the n-type drain region 300 like a loop. Further, a gate electrode 102 made of poly-silicon having a prescribed length is formed at a prescribed distance from the loop-shaped p-type doped region 100. Incidentally, while the gate electrode 102 in this embodiment is formed to substantially surround the p-type doped region 100, the n+ type drain region 130 and the n-type drain region 300 as shown in FIG. 3 in order to secure high current-driving performance, the gate electrode 102 does not necessarily have to surround the regions 100, 130 and 300 like the example in FIG. 3.

An heavily doped n+ source region 110 and a heavily doped p+ source region 120 are formed on one side of the gate electrode 102 opposite to the drain. The heavily doped n+ layer is a source layer of the MOS transistor, and hereinafter will be referred to as an "n+ source 110". A p-type channel region 140 is formed to substantially surround (cover from below) the n+ source 110 and the heavily doped p+ source region 120 and to overlap with part of the gate electrode 102 with a prescribed width from one edge. When voltage is applied to the gate electrode 102, an n-type inversion layer is formed at the surface of the p-type channel region 140 overlapping with the gate electrode 102, and electrons (carriers) injected through the n+ source 110 travel via the inversion layer to the drain region which is opposite to the source region. Thus, the p-type channel region 140 has the function of forming such a channel region for the electrons (carriers). Meanwhile, the aforementioned heavily doped p+ source region 120 is a layer for determining the electric potential of the p-type channel region 140. The heavily doped p+ source region 120 is generally connected to the source electrode 101 by ohmic contact simultaneously with the n+ source 110.

When reverse voltage is applied between the source and the drain, a depletion layer having no carriers starts spreading from the p-n junction of the p-type channel region 140 and the silicon active layer 108 as an n− drain region in the depth direction and in the horizontal direction (toward the drain. In the ordinary structure, the spread of the depletion layer in the horizontal direction toward the drain is obstructed in the vicinity of an edge of the source electrode, which causes an electric field concentration point. However, such electric field concentration is avoided in this embodiment since the p-type doped region 100, which is formed in an electrically floating state, is depleted gradually in the horizontal direction. Incidentally, the expression "electrically floating state" means that the p-type doped region 100 is formed not to make contact with a semiconductor region (for example, p-type channel region 140, n-type drain region 300, etc.) other than the silicon active layer 108 being the n− drain region.

Further, when a positive gate voltage is applied to the MOS transistor of this embodiment and an n-type inversion layer is formed at the silicon surface of the p-type channel region 140, electrons flow from the source region 110 toward the drain in the horizontal direction via the n-type inversion layer, the n− drain region 180, the n-type drain region 300 and the n+ drain region 130. Thus, the electrons do not have to traveling through a region like the aforementioned channel of a parasitic junction FET. Consequently, the aforementioned disadvantage against the size reduction of the element is eliminated in this embodiment.

FIG. 3 is a plan view showing a part of the planar pattern of the dielectric isolation semiconductor device of the first embodiment. As shown in FIG. 3, the element formation region is surrounded by twofold dielectric isolation regions 107 formed by the aforementioned deep trenches. The gate electrode is shaped to have an opening in one direction (rightward in FIG. 3) and the drain electrode is extracted in the direction of the opening so that sufficient electric discharge tolerance can be secured between the gate and drain electrodes by preventing the two electrodes from overlapping with each other. The p-type doped region 100 is formed to have a doughnut-shaped planar pattern with a prescribed width.

In this embodiment, both the source electrode 101 and the drain electrode 103 are overlapped partly with the p-type doped region 100. Even though each of the source and drain electrodes has the function of preventing the electric field concentration in silicon by pulling the source/drain electric potential, so-called "field plate" function, the electric field concentration is likely to occur in the vicinity of an edge of each electrode where a sharp change is caused to the electric potential. To avoid the electric field concentration, the oxide layer (thermal oxide) under the source and drain electrodes has to be thickened even though the oxide layer is desired to be thin for the cost reduction of the manufacturing process. However, in this embodiment, in which the edges of the electrodes are provided with the p-type doped region 100, the electric field concentration hardly occurs and it is unnecessary to thicken the oxide layer under the electrodes.

FIG. 4 is a graph comparing characteristics (collector voltage vs. collector current in the OFF-state) of a high breakdown voltage MOS transistor of this embodiment, manufactured on a trial basis to check the effect of this embodiment, in comparison with the characteristics of a MOS transistor having conventional structure. As the conventional structure, a MOS transistor without the p-type doped region 100 which is a specific structure of this embodiment was used. The "OFF-state" means a state in which both gate electric potential and source electric potential are set at 0.

As shown in FIG. 4, the conventional structure becomes incapable of maintaining the OFF-state at 1000 V due to a surge in the collector current. Meanwhile, in the high breakdown voltage MOS transistor of this embodiment, the voltage corresponding to the surge in the collector current is successfully increased by approximately 300 V.

In the following, a manufacturing method for the dielectric isolation semiconductor device 10 of the first embodiment will be described with reference to FIGS. 5A-5H.

FIGS. 5A-5H are cross-sectional views showing a manufacturing process of the dielectric isolation semiconductor device 10 of the first embodiment. The manufacturing process of the dielectric isolation semiconductor device 10 advances in the order of the FIGS. 5A-5H.

Figure 5A:
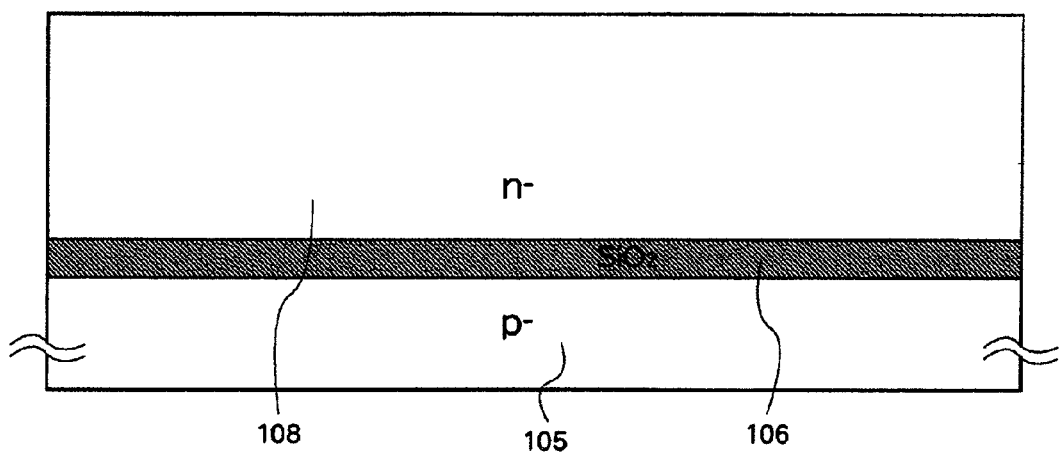
FIGS. 5A-5H are cross-sectional views showing a manufacturing process of the dielectric isolation semiconductor device of the first embodiment.

First, as shown in FIG. 5A, the SOI substrate, including the n- silicon active layer 108 stacked on one surface of the silicon support substrate 105 via the silicon dioxide layer 106, is prepared. The thickness of the silicon dioxide layer 106 may be set properly according to various specifications varying depending on the rated voltage of the semiconductor element.

In order to guarantee the long-term reliability of the dielectric isolation semiconductor device 10, a permissible electric field that may be applied to the oxide layer is determined as 2 MV/cm. In order to satisfy the condition of the permissible electric field with an element whose rated voltage is 600 V, the thickness of the silicon dioxide layer 106 has to be 3 µm or more. On the other hand, increasing the thickness of the silicon dioxide layer 106 can result in a severe warpage of the wafer since the thermal expansion coefficient of the silicon dioxide layer 106 differs from that of silicon. The increase in the warpage of the wafer hinders the installation of the wafer in a photolithography apparatus and in a dry etching equipment. Thus, the thickness of the embedded silicon dioxide layer has to be set within 4 µm.

Figure 6:
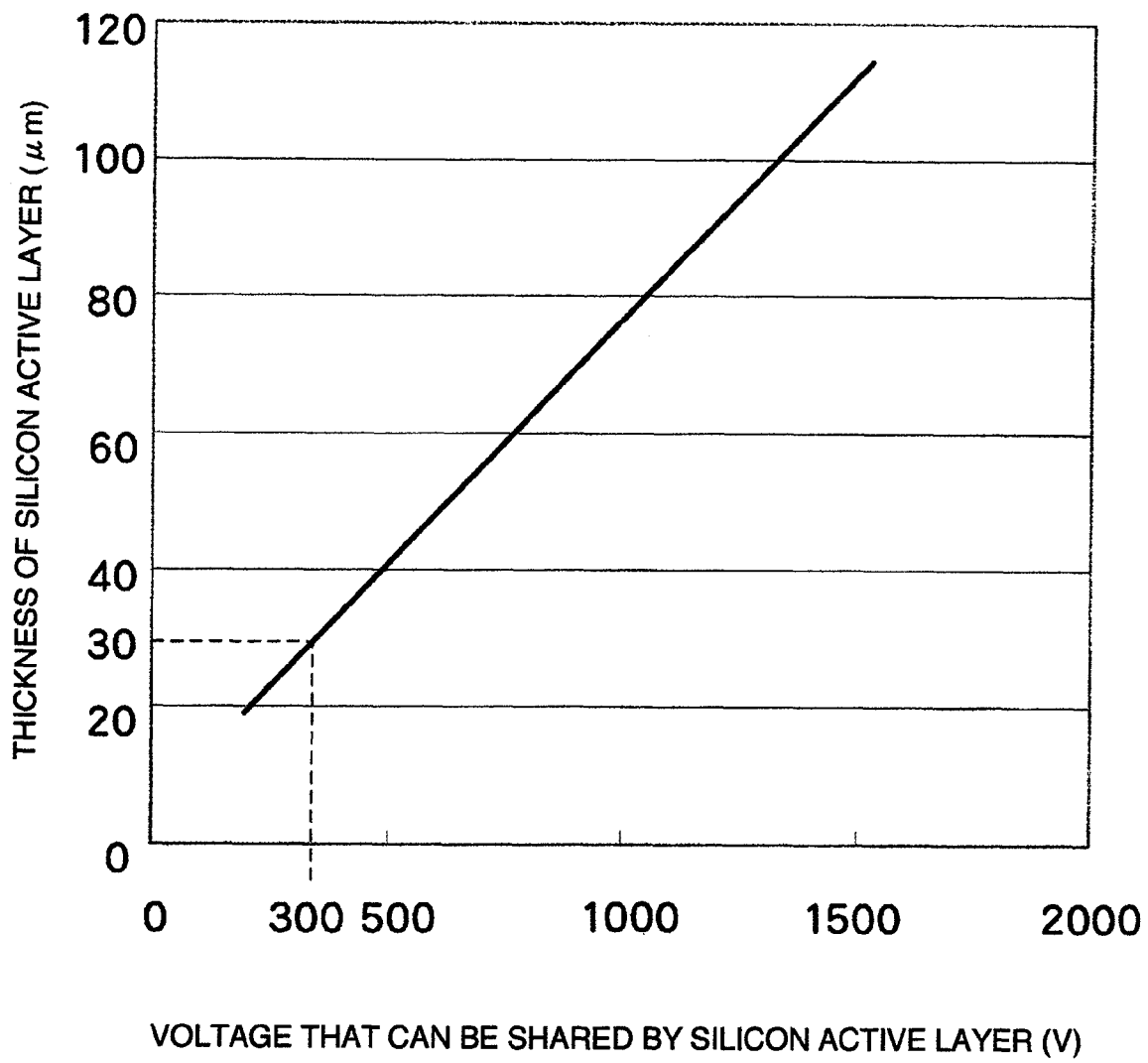
FIG. 6 is a graph showing voltage that can be borne (shared) by a silicon active layer of the dielectric isolation semiconductor device.

We attained the following conclusion by considering the voltage that can be borne (shared) by the silicon side (108) based on a graph of FIG. 6. Referring to FIG. 6, the n- silicon active layer 108 is capable of bearing 300 V when its thickness is 30 µm. Meanwhile, the embedded oxide layer 106 is capable of bearing 800 V at the maximum. Thus, a high breakdown voltage element capable of bearing 1100 V can be realized by the combination of the two layers. In the motor drive system 1 to which the high breakdown voltage dielectric isolation semiconductor device 10 in accordance with the present invention is applied, at least a high voltage of 1000 V or more has to be realized. In order to satisfy the condition, the thickness of the silicon active layer 108 should be 30 µm or more.

Figure 5B:
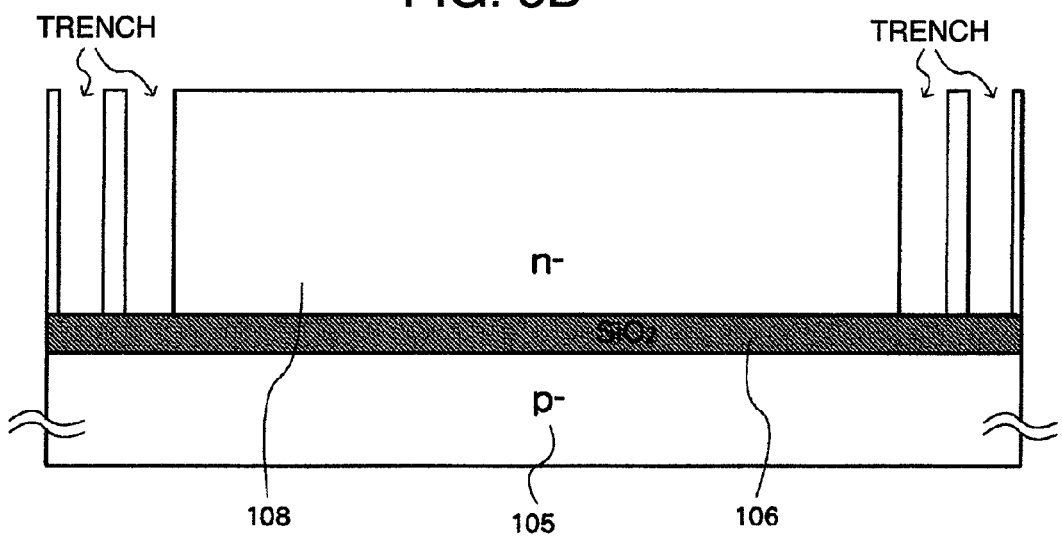

Referring to FIG. 5B, substantially perpendicular trenches reaching from the primary surface of the n- silicon active layer 108 to the embedded oxide layer 106 are formed by use of the dry etching equipment. The width of the trench is set at approximately 2 µm since the filling of the trench becomes more difficult as the trench width increases.

Figure 5C:
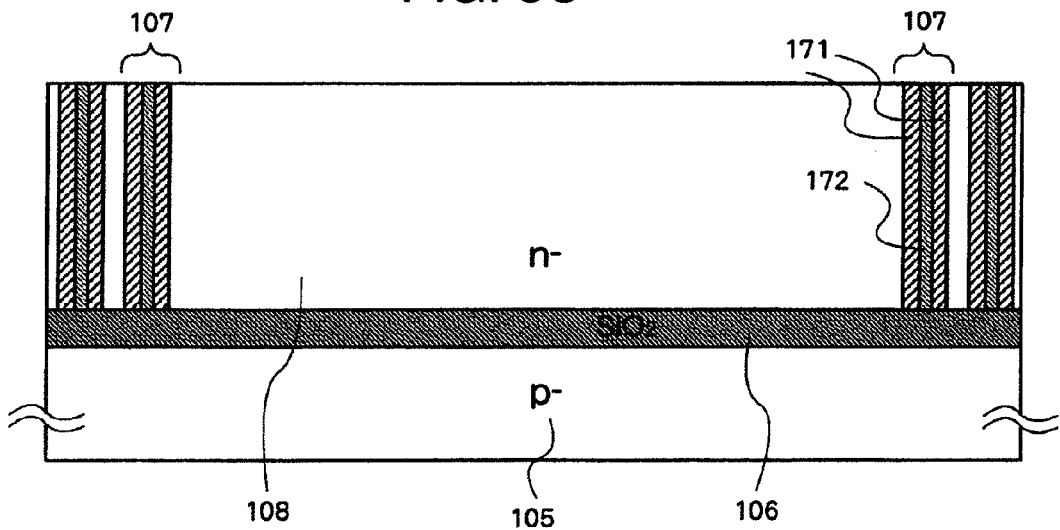

Referring to FIG. 5C, the SOI substrate with the perpendicular trenches formed therein is heat-treated in an oxidizing atmosphere to form the silicon dioxide films 171 on the side walls of the trenches. Subsequently, the dielectric isolation regions 107 are completed by filling the gaps of the trenches with the polysilicon layers 172 by the CVD (Chemical Vapor Deposition) method.

Figure 5D:
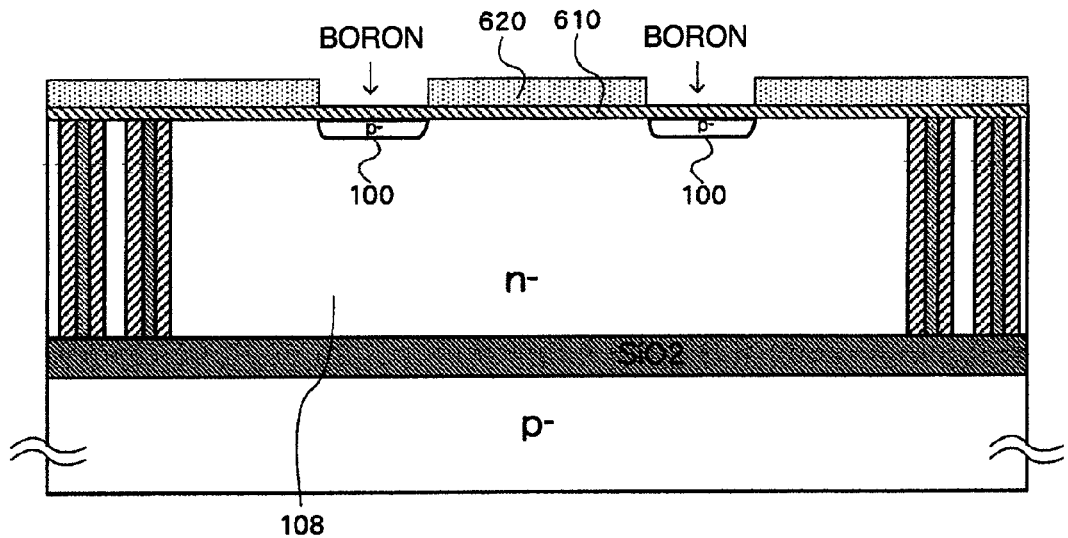

Referring to FIG. 5D, the primary surface of the n- silicon active layer 108 is covered with a silicon dioxide layer 610 and a photoresist layer 620. A part of the photoresist in an area for the formation of the p-type doped region 100 is removed by photolithography, and boron ions are implanted into the silicon via the opening of the photoresist by the ion implantation technology. The accelerating voltage is set at approximately 10 keV-50 keV and the dose amount is set at approximately $10^{12}$ ions/cm$^2$.

Figure 5E:
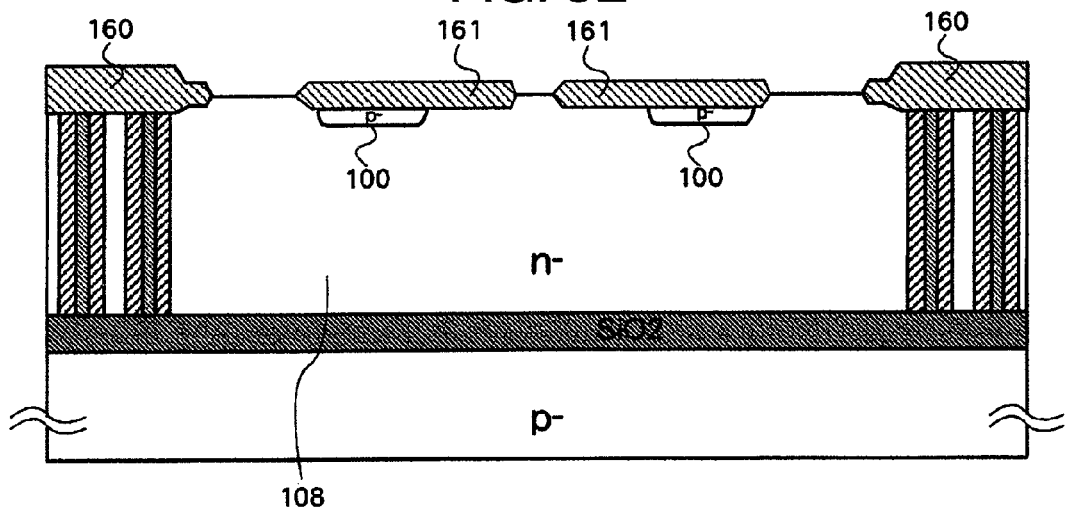

Referring to FIG. 5E, a thick field oxide layer 160 and a thin field oxide layer 161 are formed by repeating selective oxidation using a silicon nitride layer twice. It is also possible to form three oxide layers of different thicknesses by repeating selective oxidation three times.

Figure 5F:
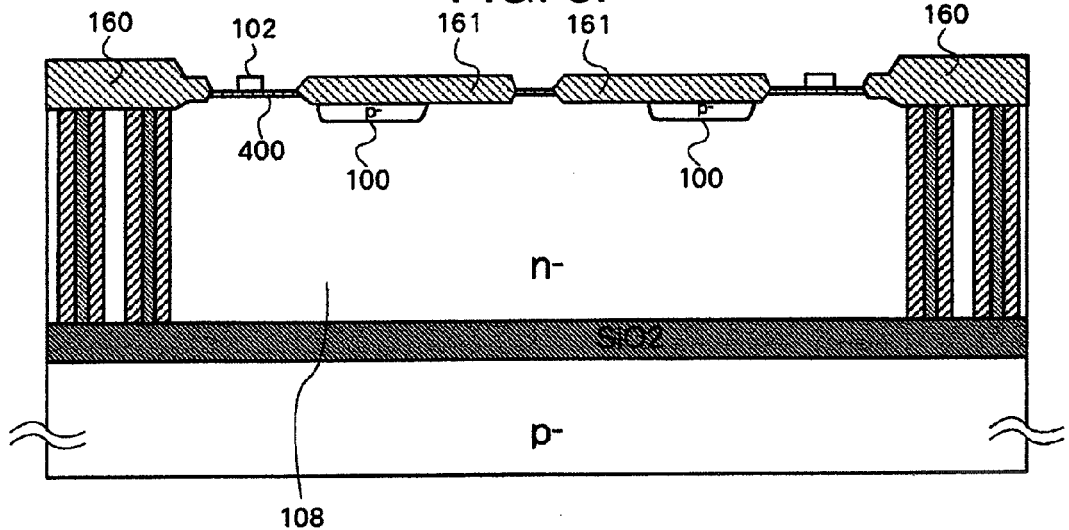

Referring to FIG. 5F, a gate oxide layer 400 is formed on the primary surface of the silicon active layer 108 by depositing silicon dioxide to a thickness of 50 nm-80 nm. Subsequently, the gate electrode 102 is formed by depositing a polysilicon layer on the gate oxide layer 400 and patterning the polysilicon layer by use of ordinary dry etching equipment.

Figure 5G:
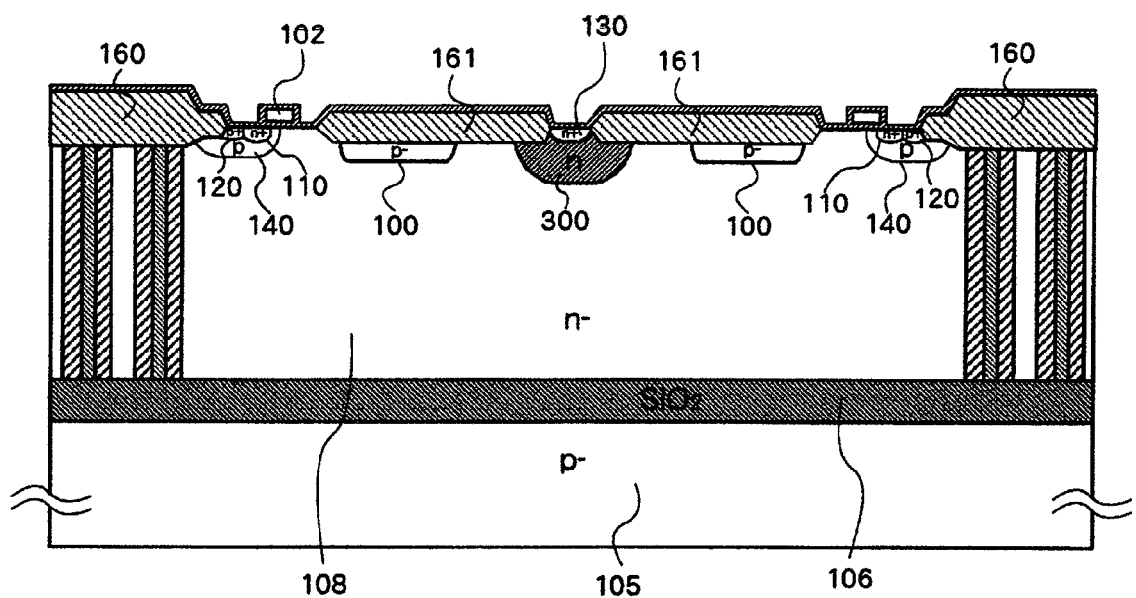

Referring to FIG. 5G, the p-type channel region 140 of the high breakdown voltage n-channel MOS transistor is formed by implanting boron ions in self-alignment with the gate electrode 102 at an accelerating voltage of several tens of keV. Subsequently, the n-type drain region 300 is formed by implanting phosphorus ions at an accelerating voltage of 100 keV. Further, the n+ source region 110, the p+ source region 120 and the drain region 130 are respectively formed by ion implantation in self-alignment with the gate electrode 102 and the field oxide layer 161.

Figure 5H:
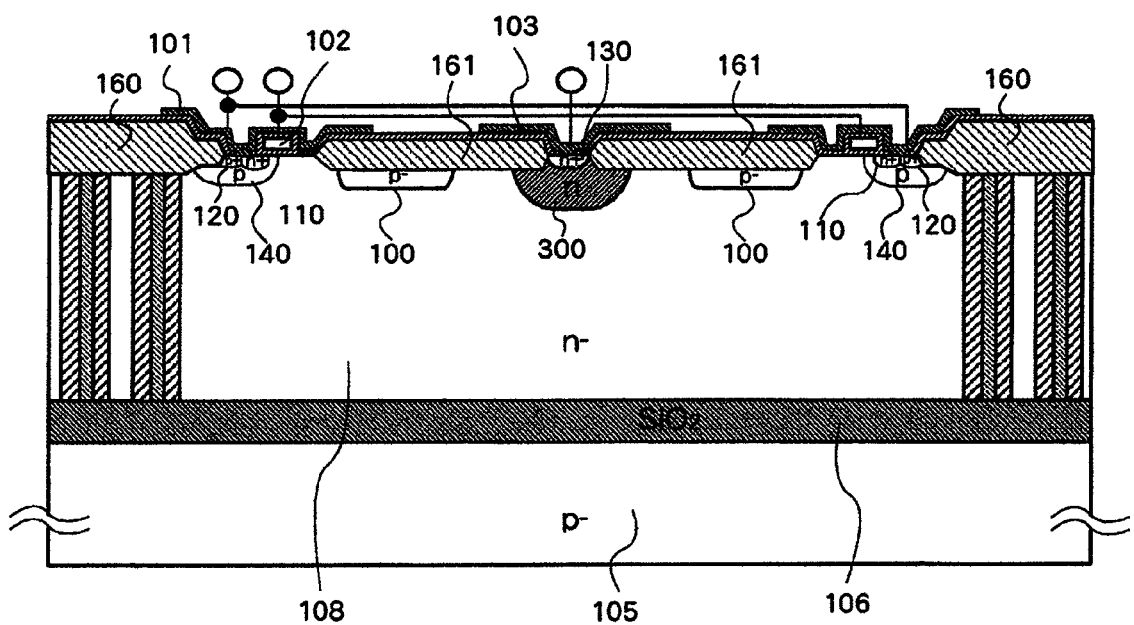

Referring to FIG. 5H, the source electrode 101 and the drain electrode 103 are formed by executing processes necessary for ordinary semiconductor manufacturing, such as a process for depositing a silicon dioxide layer by CVD and forming openings through the silicon dioxide layer (at positions corresponding to the source, gate, collector, etc. of each element needing electric connection) by use of dry etching equipment, a process for forming/processing aluminum-based electrodes by sputtering, etc. Thereafter, electrode-extraction openings in the final state are formed by depositing a silicon nitride layer for the protection of the elements from penetration of impurity such as water. By the above processes, the dielectric isolation semiconductor device 10 is completed.

In the following, other embodiments in accordance with the present invention will be described.

Embodiment 2

First, a dielectric isolation semiconductor device in accordance with a second embodiment of the present invention will be described below.

Figure 7:
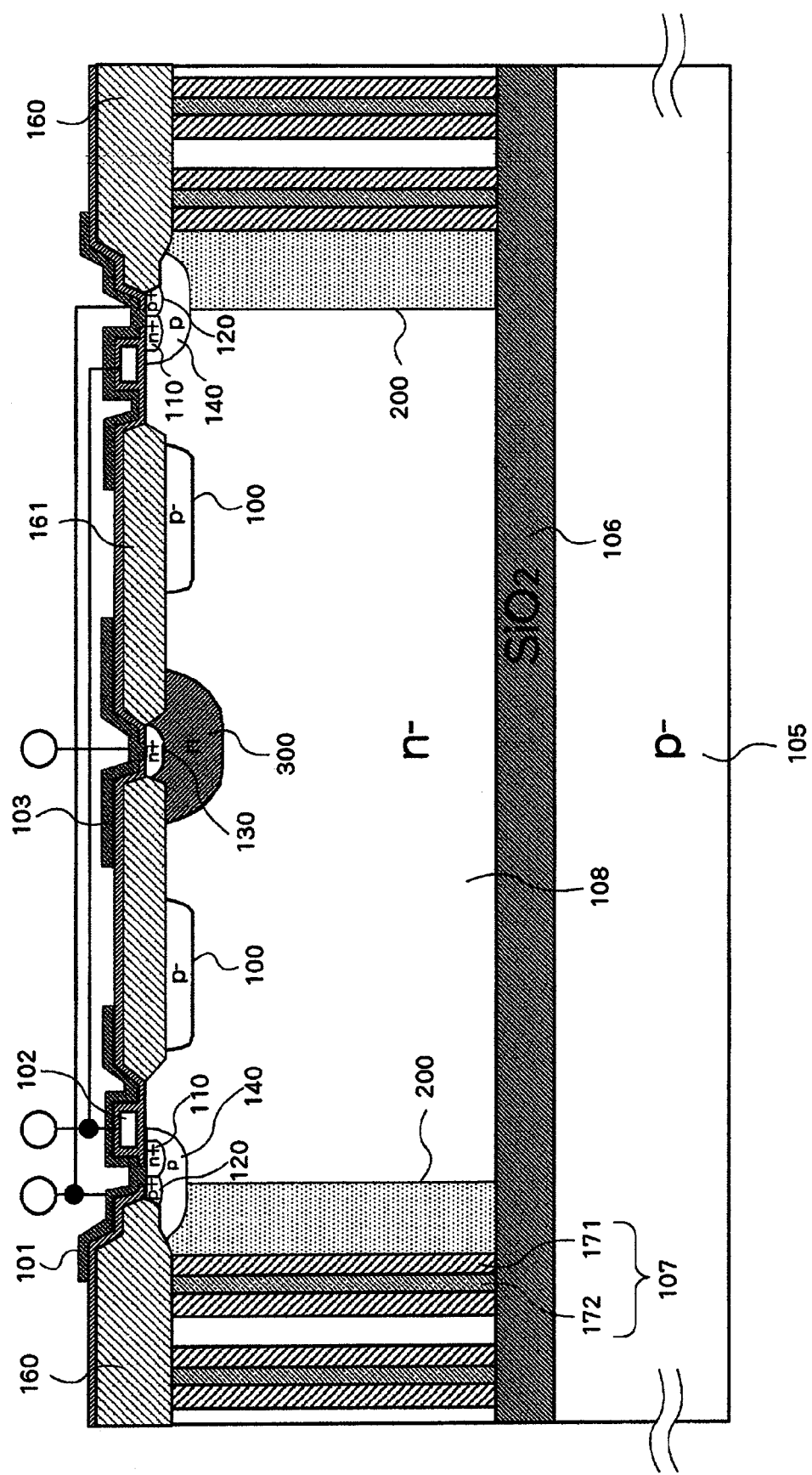
FIG. 7 is a cross-sectional view showing a dielectric isolation semiconductor device in accordance with a second embodiment of the present invention.

FIG. 7 is a cross-sectional view showing the principal part of the dielectric isolation semiconductor device in accordance with the second embodiment. In the dielectric isolation semiconductor device of the second embodiment, a p-type impurity diffusion region 200 is formed on the inner side face of the dielectric isolation region 107.

The p-type impurity diffusion region 200 makes contact with the p-type channel region 140 in the vicinity of the silicon surface. In this embodiment, when reverse voltage is applied between the source and the drain, the spread of the depletion layer from the source side starts from the p-type channel region 140 and the p-type impurity diffusion region 200, thereby the spread of the depletion layer in the horizontal direction is facilitated in comparison with the structure in the first embodiment. Thus, even when the impurity concentration in the active layer of the SOI substrate for the formation of each element, i.e. the silicon active layer 108 as the n- drain region, is increased, the spread of the depletion layer in the horizontal direction is not hampered and the deterioration of the breakdown voltage due to the electric field concentration can be prevented. In other words, increasing the ON current becomes possible since the impurity concentration in the silicon active layer 108 as the n- (low impurity concentration) drain region can be increased without deteriorating the breakdown voltage.

Embodiment 3

Next, a dielectric isolation semiconductor device in accordance with a third embodiment of the present invention will be described below.

Figure 8:
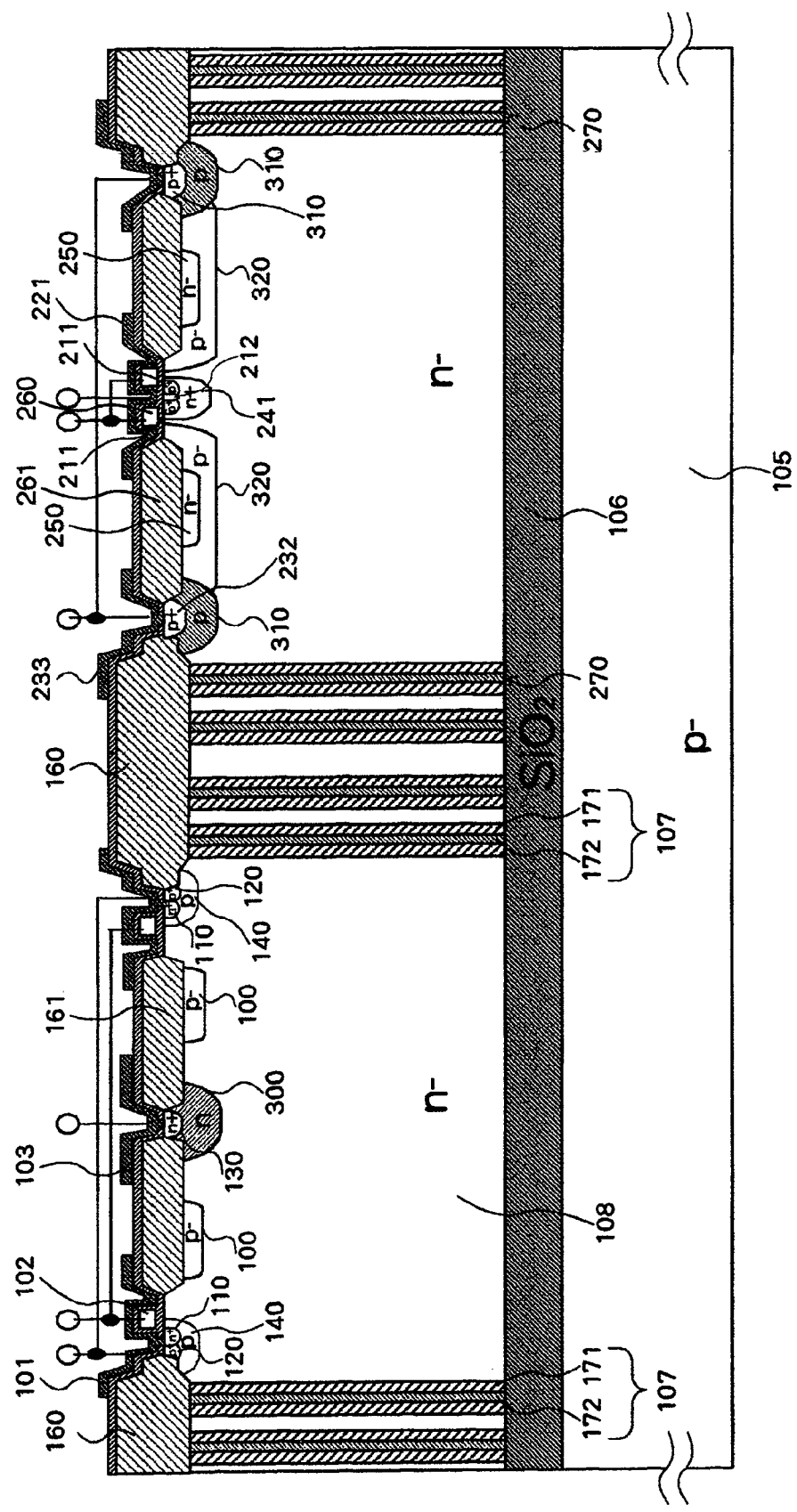
FIG. 8 is a cross-sectional view showing a dielectric isolation semiconductor device in accordance with a third embodiment of the present invention.

FIG. 8 is a cross-sectional view showing the dielectric isolation semiconductor device in accordance with the third embodiment. The dielectric isolation semiconductor device of the third embodiment, employing the SOI substrate of the high breakdown voltage n-channel MOS (NMOS) transistor of the first embodiment, further includes a high breakdown voltage p-channel MOS (PMOS) transistor. While the NMOS transistor and the PMOS transistor are adjoining each other in FIG. 8, they may also be separated from each other as long as an NMOS transistor and a PMOS transistor are implemented on one SOI substrate. The PMOS transistor in this embodiment is configured in a region (area) surrounded by two dielectric isolation regions 270 which are formed simultaneously with, in the same structure as, and by the same process as the two dielectric isolation regions 107 surrounding the NMOS transistor. In this case, the source region and the gate region of the PMOS transistor are placed substantially at the center of the area surrounded by the dielectric isolation regions 270, while the drain region of the PMOS transistor is placed in the vicinity of the dielectric isolation regions 270.

The source region of the PMOS transistor is made up of a heavily doped p+ source region 211 and an heavily doped n+ source region 212. The source regions 211 and 212 are surrounded (covered from below) by an n-type doped region 241. The n-type doped region 241 has the function of forming a p-type inversion layer with the presence of the gate voltage. A lightly doped p– drain region 320 is formed on one side of a gate electrode 260 opposite to the source region. Outside the p– lightly doped drain region 320 (i.e. between the p– lightly doped drain region 320 and the (inner) dielectric isolation region 270), the drain region of the PMOS transistor is formed by a heavily doped p+ region 232 and a p-type doped region 310 which are formed continuously. To the source region and the drain region, a source electrode 221 and a drain electrode 233 are connected by ohmic contact, respectively.

Between the source electrode 221 and the drain electrode 233, a field oxide layer 261 is formed to adjoin at least part of the periphery of the lightly doped p– drain region 320 and part of the periphery of the heavily doped p+ region 232.

In the lightly doped p– drain region 320 of the PMOS transistor, an n-type doped region 250 having a conductivity type different from that of the lightly doped drain region 320) is formed in a planar shape like a doughnut surrounding the source region. The n-type doped region 250 is placed in an aforementioned electrically floating state. By the floating region 250 of the conductivity type opposite to that of the lightly doped drain region 320, the formation of the electric field concentration points in the vicinity of the edges of the source and drain electrodes can be prevented, by which the breakdown voltage of the PMOS transistor can be increased.

With the dielectric isolation semiconductor device in accordance with the third embodiment, a high breakdown voltage n-channel MOS transistor and a high breakdown voltage p-channel MOS transistor can be implemented at the same time, by which a low-loss level shift circuit can be realized.

Embodiment 4

Next, a dielectric isolation semiconductor device in accordance with a fourth embodiment of the present invention will be described below.

Figure 9:
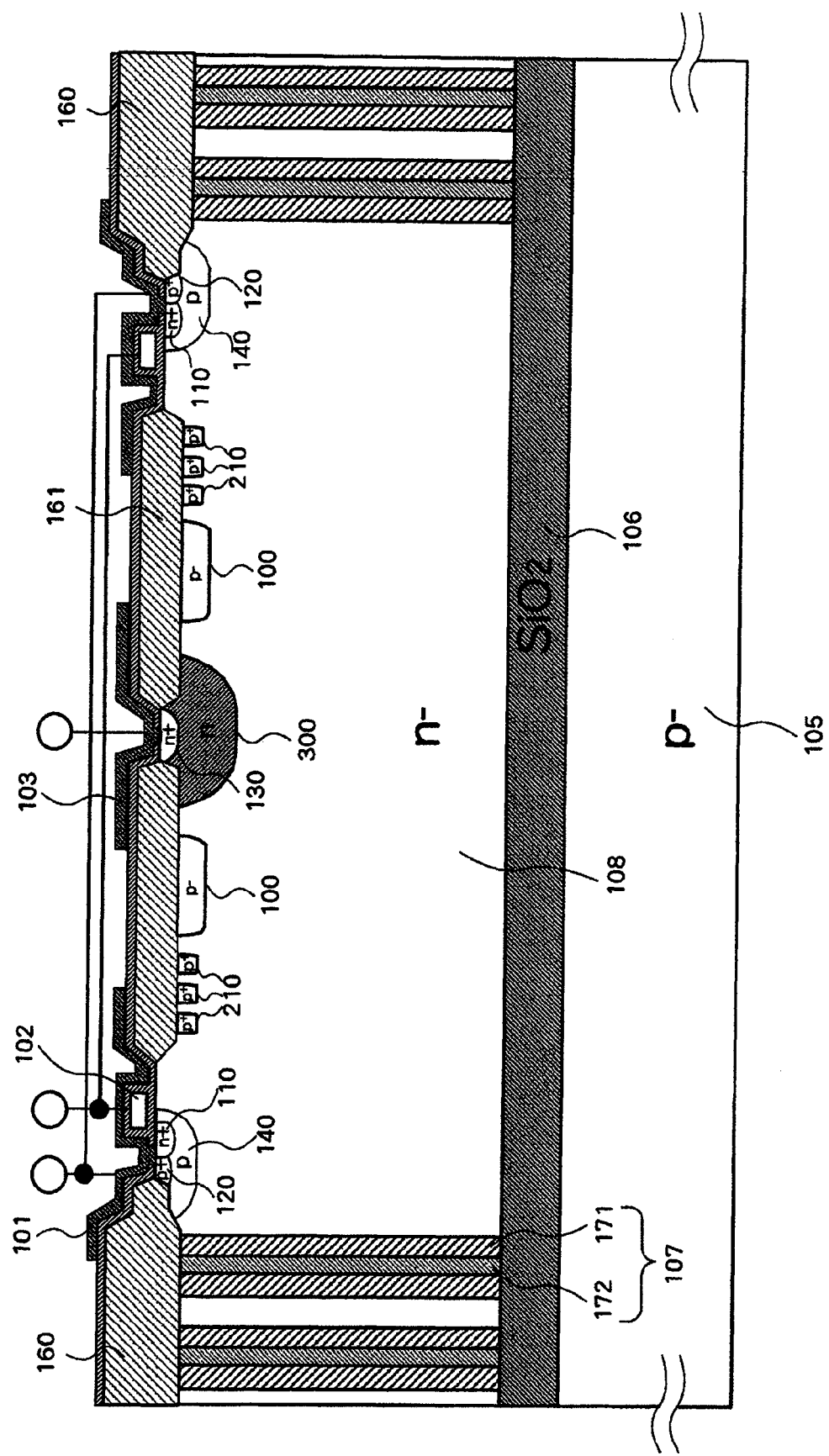
FIG. 9 is a cross-sectional view showing a dielectric isolation semiconductor device in accordance with a fourth embodiment of the present invention.

FIG. 9 is a cross-sectional view showing the dielectric isolation semiconductor device in accordance with the fourth embodiment. In the fourth embodiment, a high breakdown voltage n-channel MOS transistor is employed as the MOS transistor similarly to the first embodiment. In the vicinity of a lateral edge of the source electrode 101 on the drain's side, p+ doped layers 210 having a width of approximately 1 μm-3 μm, as multifold ring regions surrounding the drain region, are formed on the silicon surface of the lightly doped n– drain region 108. In this embodiment, the p– doped region 100 explained in the first embodiment is also formed. By the ring regions 210 and the p– doped region 100, the electric field concentration in the vicinity of the edges of the source and the drain electrodes is relaxed.

Embodiment 5

Next, a dielectric isolation semiconductor device in accordance with a fifth embodiment of the present invention will be described below.

Figure 10:
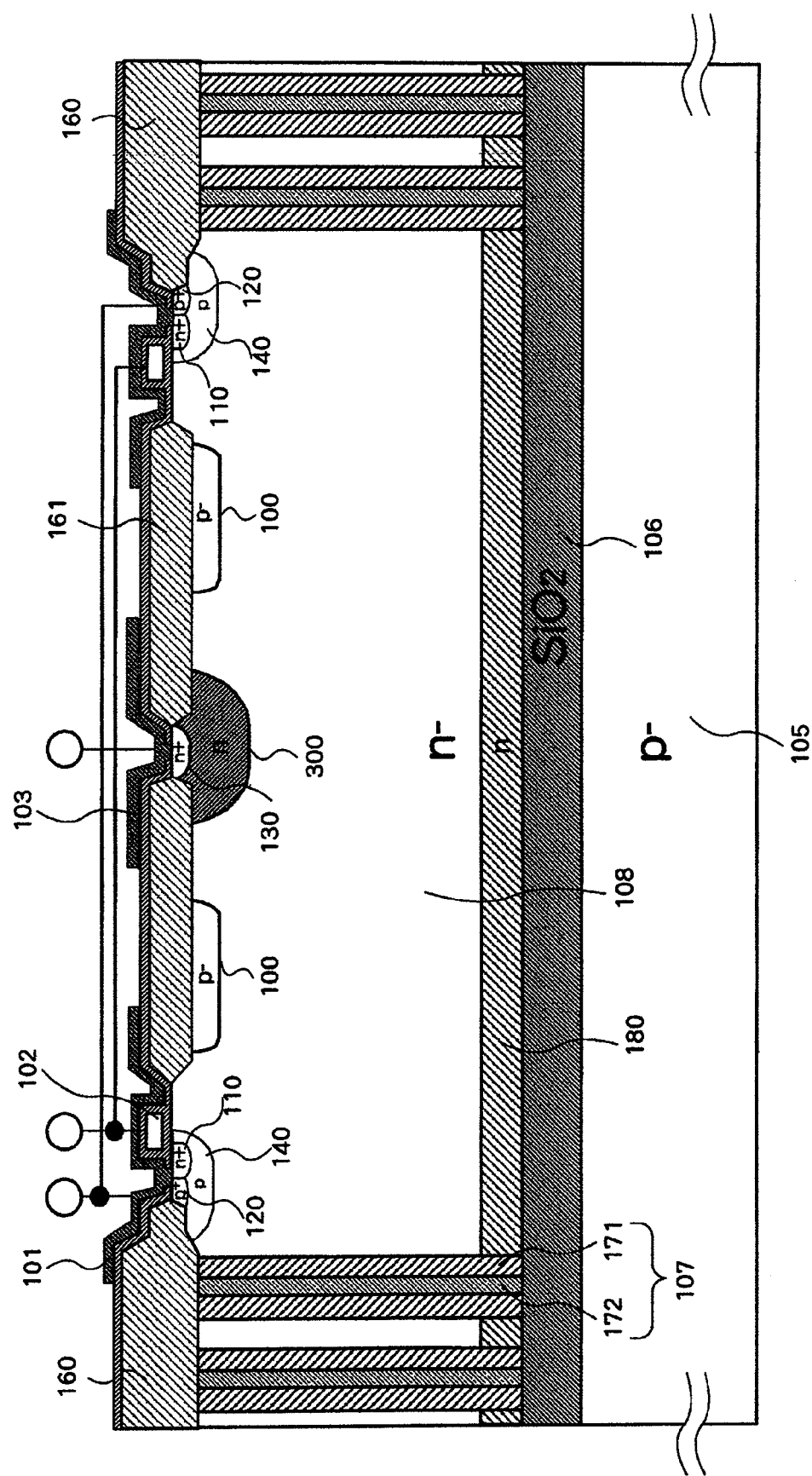
FIG. 10 is a cross-sectional view showing a dielectric isolation semiconductor device in accordance with a fifth embodiment of the present invention.

FIG. 10 is a cross-sectional view showing the dielectric isolation semiconductor device in accordance with the fifth embodiment. In the fifth embodiment, the present invention is applied to a high breakdown voltage n-channel MOS transistor similarly to the first embodiment. In this embodiment, an n-type doped layer 180 is formed under the lower primary surface of the lightly doped n– drain layer (silicon active layer 108) to adjoin the embedded oxide layer 106. The n-type doped layer 180 is a layer having a higher impurity concentration than the silicon active layer 108 as the n– drain region. By providing the drain region with such a region having a slightly higher impurity concentration (n-type doped layer 180) as in this embodiment, the voltage shared by the silicon region decreases and the voltage shared by the embedded oxide layer 106 increases. With this configuration, the whole voltage applicable to the drain electrode can be raised and the breakdown voltage of the dielectric isolation semiconductor device can be increased.

Incidentally, while the n-type doped layer 180 is formed to totally adjoin the embedded oxide layer 106 in this embodiment, the n-type doped layer 180 may also be formed partially. In such cases, the n-type doped layer 180 is placed at least under the area where the drain regions 130 and 300 are formed.

Embodiment 6

Next, a dielectric isolation semiconductor device in accordance with a sixth embodiment of the present invention will be described below.

Figure 11:
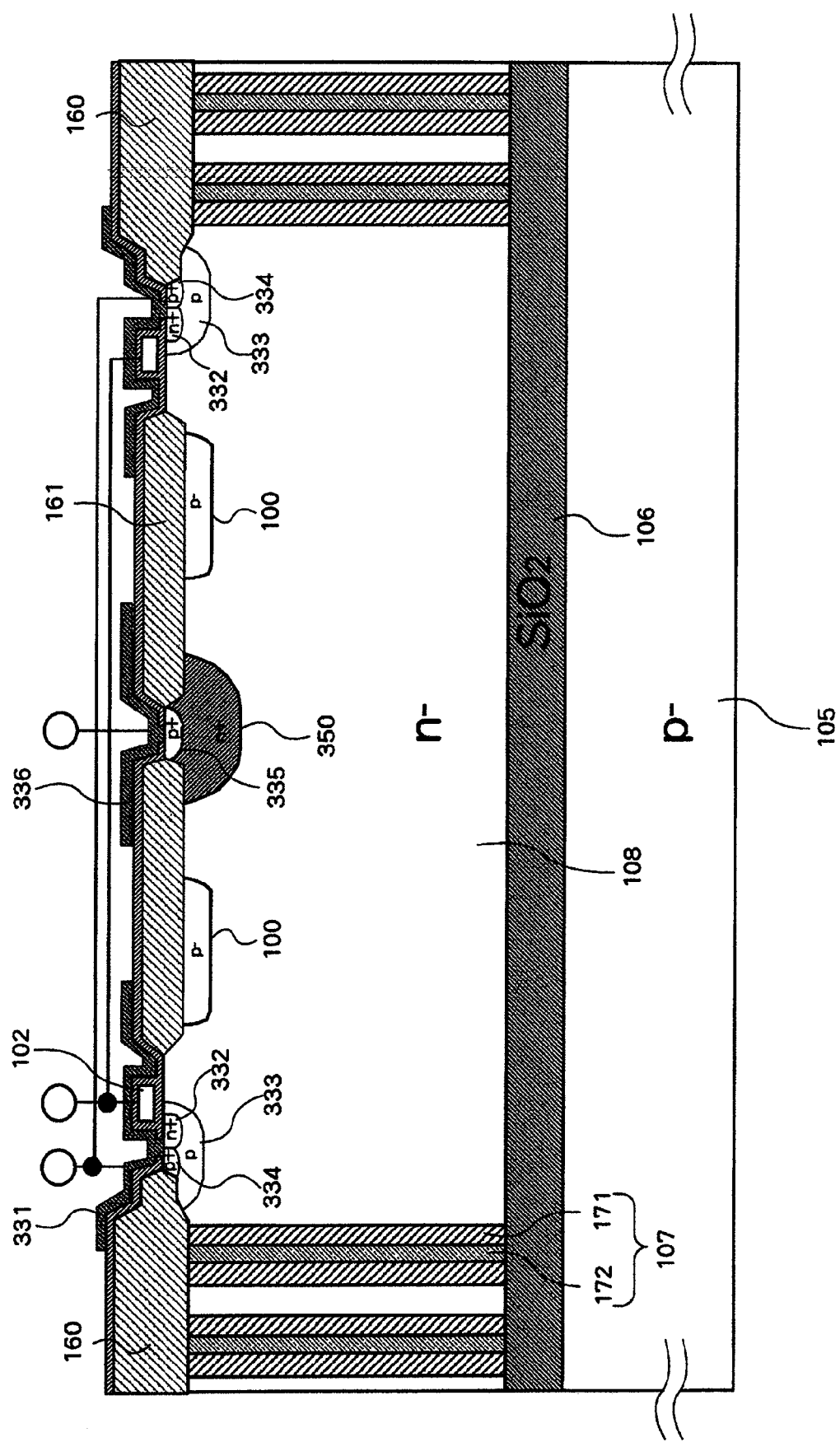
FIG. 11 is a cross-sectional view showing a dielectric isolation semiconductor device in accordance with a sixth embodiment of the present invention.

FIG. 11 is a cross-sectional view showing the dielectric isolation semiconductor device in accordance with the sixth embodiment. In the sixth embodiment, the present invention is applied to an IGBT (Insulated Gate Bipolar Transistor) including a gate electrode 102, an emitter electrode 331 and a collector electrode 336. An heavily doped n+ layer 350 is formed substantially in the central area of the silicon active layer 108 surrounded by the dielectric isolation region 107, and a p+ heavily doped layer 335 is formed in the heavily doped n+ layer 350.

The heavily doped p+ layer 335 called "collector" has the function of injecting holes into the lightly doped n– layer. Meanwhile, the heavily doped n+ layer 350 has the function of controlling the injection rate of the holes. An heavily doped n+ layer 332 connected to the emitter electrode 331 by ohmic contact, which is called "emitter", has the function of injecting electrons.

A p-type doped layer 333, which is formed to surround the emitter 332 and a p+ heavily doped layer 334, is a p-channel region capable of forming an n-type inversion layer on its surface with the presence of the gate voltage. In the case of an IGBT element, when such an n-type inversion layer is formed and electrons are injected from the emitter 332, holes are correspondingly injected from the collector 335 to the lightly doped n– collector layer. Then, electrons are further injected from the emitter 332 to neutralize the holes, causing accumulation of electrons and holes in the silicon active layer 108 being a lightly doped n-region and a sharp drop in the resistance. The low ON voltage character of the IGBT element is achieved as above. In this regard, a semiconductor switching element having a lower loss than an NMOS transistor can be realized by the IGBT element. Incidentally, the IGBT element described above may be formed on the same substrate together with the MOS transistor described in any of the previous embodiments.

It should be further understood by those skilled in the art that although the foregoing description has been on embodiments of the invention, the invention is not limited thereto and various changes and modifications may be made without departing from the spirit of the invention and the scope of the appended claims.

The invention claimed is:

1. A semiconductor device comprising:
a silicon support substrate;
a silicon oxide layer stacked on said silicon support substrate;
a silicon active layer stacked on said silicon oxide layer; and
a high-breakdown-voltage MOS transistor provided in a region of said silicon active layer defined by use of dielectric material for isolation extending from a primary surface of said silicon active layer to said silicon oxide layer, wherein said MOS transistor shifts a voltage level of a high voltage gate driving circuit, which supplies a control signal to a gate of a top arm power element, to a high voltage level, and wherein:
said MOS transistor includes:
drain region implemented by said silicon active layer;
a doped region located in said silicon active layer and having a conductivity type opposite to that of said silicon active layer; and
a field oxide layer provided between a source electrode and a drain electrode to adjoin at least part of a surface of said silicon active layer, and
wherein said doped region is formed in an electrically floating state at a position where said silicon active layer adjoins said field oxide layer and in a doughnut-shaped planar pattern in said drain region, and is overlapped partly with the source electrode.

2. The semiconductor device according to claim 1, wherein:
the thickness of said silicon oxide layer is set at 4 μm or less, and
the thickness of said silicon active layer is set at 30 μm or more.

3. The semiconductor device according to claim 2, wherein at least part of said doped region is placed under said source electrode.

4. The semiconductor device according to claim 2, wherein:
said MOS transistor further includes a semiconductor region contained in said silicon active layer and having the same conductivity type as said silicon active layer and a higher impurity concentration than said silicon active layer, and
said semiconductor region is formed at least under a drain-extracting region on a surface of said silicon active layer adjoining said silicon oxide layer.

5. The semiconductor device according to claim 2, wherein:
said MOS transistor further includes a semiconductor region contained in said first semiconductor region and having the same conductivity type as said second semiconductor drain region, and
said semiconductor region is formed under said source electrode to spread to a side face of said dielectric isolation region.

6. The semiconductor device according to claim 2, wherein:
said MOS transistor further includes at least one semiconductor region contained in said silicon active layer and having the same conductivity type as said doped region and a higher impurity concentration than said doped region, and
said semiconductor region is formed on part of a surface of said silicon active layer on the side of said source electrode to surround said doped region.

7. The semiconductor device according to claim 1, wherein at least part of said doped region is placed under said source electrode.

8. The semiconductor device according to claim 7, wherein:
said MOS transistor further includes a semiconductor region contained in said silicon active layer and having the same conductivity type as said silicon active layer and a higher impurity concentration than said silicon active layer, and
said semiconductor region is formed at least under a drain-extracting region on a surface of said silicon active layer adjoining said silicon oxide layer.

9. The semiconductor device according to claim 7, wherein:
said MOS transistor further includes a semiconductor region contained in said silicon active layer and having the same conductivity type as said doped region, and
said semiconductor region is formed under said source electrode to spread to a side face of said dielectric isolation region.

10. The semiconductor device according to claim 7, wherein:
said MOS transistor further includes at least one semiconductor region contained in said silicon active layer and having the same conductivity type as said second doped region and a higher impurity concentration than said doped region, and
said semiconductor region is formed on part of a surface of said silicon active layer on the side of said source electrode to surround said doped region.

11. The semiconductor device according to claim 1, wherein:
said MOS transistor further includes a semiconductor region contained in said silicon active layer and having the same conductivity type as said silicon active layer and a higher impurity concentration than said silicon active layer, and
said semiconductor region is formed at least under a drain-extracting region on a surface of said silicon active layer adjoining said silicon oxide layer.

12. The semiconductor device according to claim 11, wherein:
said MOS transistor further includes a another semiconductor region contained in said silicon active layer and having the same conductivity type as said doped region, and said semiconductor region is formed under said source electrode to spread to a side face of said dielectric isolation region.

13. The semiconductor device according to claim 11, wherein:
said MOS transistor further includes at least one other semiconductor region contained in said silicon active layer and having the same conductivity type as said doped region and a higher impurity concentration than said doped region, and
said other semiconductor region is formed on part of a surface of said silicon active layer on the side of said source electrode to surround said doped region.

14. The semiconductor device according to claim 1, wherein:
said MOS transistor further includes a semiconductor region contained in said silicon active layer and having the same conductivity type as said doped region, and
said semiconductor region is formed under said source electrode to spread to a side face of said dielectric isolation region.

15. The semiconductor device according to claim 14, wherein:
said MOS transistor further includes at least one other semiconductor region contained in said silicon active layer and having the same conductivity type as said doped region and a higher impurity concentration than said doped region, and
said other semiconductor region is formed on part of a surface of said silicon active region on the side of said source electrode to surround said doped region.

16. The semiconductor device according to claim 1, wherein:
said MOS transistor further includes at least one semiconductor region contained in said silicon active layer and having the same conductivity type as said doped region and a higher impurity concentration than said doped region, and
said semiconductor region is formed on part of a surface of said silicon active layer on the side of said source electrode to surround said doped region.

17. A semiconductor device comprising:
a silicon support substrate;
a silicon oxide layer stacked on said silicon support substrate;
a silicon active layer stacked on said silicon oxide layer; and
a high-breakdown-voltage first conductivity type MOS transistor provided in a first region of said silicon active layer defined by use of dielectric material for isolation extending from a primary surface of said silicon active layer to said silicon oxide layer, wherein said first conductivity type MOS transistor forms a first conductivity type channel and shifts a voltage level of a high voltage gate driving circuit, which supplies a control signal to a gate of a top arm MOS transistor, to a high voltage level, and
a high-breakdown-voltage second conductivity type MOS transistor, provided in a separate, second region of said silicon active layer defined by use of said dielectric material for isolation extending from said primary surface of said silicon active layer to said silicon oxide layer, wherein said second conductivity type MOS transistor forms a second conductivity type channel and shifts a voltage level of said high voltage gate driving circuit, which supplies a control signal to said gate of said top arm MOS transistor, to a high voltage level, wherein:
said first conductivity type MOS transistor includes:
drain region implemented by said silicon active layer;
a doped region located in said silicon active layer and having a conductivity type opposite to that of said silicon active layer; and
a first field oxide layer provided between a source electrode and a drain electrode to adjoin at least part of a surface of said silicon active layer,
wherein said doped region is formed in an electrically floating state at a position where said silicon active layer adjoins said first field oxide layer, and in a doughnut-shaped planar pattern in said drain region, and is overlapped partly with the source electrode,
said second conductivity type MOS transistor includes:
a low impurity concentration drain region and a high impurity concentration drain region, which has an impurity concentration higher than said low impurity concentration drain region, located in said silicon active layer and having a conductivity type opposite to that of said silicon active layer;
a source electrode and a gate electrode surrounded by said low impurity concentration drain region and said high impurity concentration drain region;
a doped region located in said low impurity concentration drain region and having a conductivity type opposite to that of said low impurity concentration drain region; and
a second field oxide layer which is provided between said source electrode and said drain regions to adjoin at least part of a surface of said low impurity concentration drain region and part of a surface of said high impurity concentration drain region,
wherein said doped region is formed in the electrically floating state at a position where said low impurity concentration drain region adjoins said second field oxide layer in a doughnut-shaped planar pattern in said low impurity concentration drain region, and is overlapped partly with the source electrode.

18. A semiconductor device comprising:
a silicon support substrate;
a silicon oxide layer stacked on said silicon support substrate;
a silicon active layer stacked on said silicon oxide layer; and
a high-breakdown-voltage IGBT provided in a region of said silicon active layer defined by use of dielectric material for isolation extending from a primary surface of said silicon active layer to said silicon oxide layer, wherein:
said IGBT includes:
a collector region implemented by said silicon active layer;
a doped region located in said silicon active layer and having a conductivity type opposite to that of said silicon active layer; and
a field oxide layer provided between an emitter electrode and a collector electrode to adjoin at least part of a surface of said silicon active layer, and
wherein said doped region is formed in an electrically floating state at a position where said silicon active layer adjoins said field oxide layer and in a doughnut-shaped planar pattern in said collector region, and is overlapped partly with the emitter electrode.

* * * * *